(12) United States Patent
Rotzoll et al.

(10) Patent No.: US 10,873,322 B2
(45) Date of Patent: Dec. 22, 2020

(54) DETECTOR CIRCUIT FOR AN RFID-DEVICE

(71) Applicant: EM Microelectronic-Marin S.A., Marin (CH)

(72) Inventors: Robert R Rotzoll, Cascade, CO (US); Kevin Scott Buescher, Colorado Springs, CO (US)

(73) Assignee: EM Microelectronic-Marin S.A., Marin (CH)

( * ) Notice: Subject to any disclaimer, the term of this patent is extended or adjusted under 35 U.S.C. 154(b) by 70 days.

(21) Appl. No.: 16/142,751

(22) Filed: Sep. 26, 2018

(65) Prior Publication Data

US 2020/0099366 A1    Mar. 26, 2020

(51) Int. Cl.
*H03K 3/011* (2006.01)
*G05F 3/16* (2006.01)
(Continued)

(52) U.S. Cl.
CPC .............. *H03K 3/011* (2013.01); *G05F 3/16* (2013.01); *G06K 7/10366* (2013.01);
(Continued)

(58) Field of Classification Search
CPC ............ G06K 5/00; G06K 7/08; G06K 17/00; G06K 19/00; G06K 19/06; G06K 7/10366;
(Continued)

(56) References Cited

U.S. PATENT DOCUMENTS

| 5,079,454 A | 1/1992 | Benton et al. |
| 7,375,578 B1 | 5/2008 | Blanchard et al. |

(Continued)

FOREIGN PATENT DOCUMENTS

| EP | 2 874 309 A1 | 5/2015 |
| JP | 2012-34335 A | 2/2012 |
| JP | 2016-528755 | 9/2016 |

OTHER PUBLICATIONS

Li, C. et al. "A Folded, Low-Power Ultra-Wideband CMOS Power Detector with an Embedded Amplifier", IEEE Transactions on Magnetics, Clemson University, 2009, p. 7.
European Search Report dated Feb. 11, 2020 in European Patent Application No. 19182368.1, 6 pages.
Japanese Notice of Reasons for Refusal dated Sep. 15, 2020 in corresponding Japanese Patent Application No. 2019-140681 (with English translation), 9 pages.

*Primary Examiner* — Thien M Le
*Assistant Examiner* — April A Taylor
(74) *Attorney, Agent, or Firm* — Oblon, McClelland, Maier & Neustadt, L.L.P.

(57) ABSTRACT

A detector circuit being part of a Radio Frequency Identification (RFID) device is provided, including: a bias current generator circuit configured to generate an output bias current that is proportional to the square of a temperature-dependent input current; first and second Field-Effect Transistor (FET) devices; at least one of the first and the second FET devices is biased by means of the output bias current of the bias current generator circuit so that FET device(s) operates in a sub-threshold region; an incoming Radio Frequency (RF) signal being coupled into at least one of the first and the second FET devices; a current source configured to generate a variable threshold current; and a comparator configured to determine, based on the variable threshold current and the incoming RF signal, whether a value of the incoming RF signal exceeds a threshold value.

11 Claims, 2 Drawing Sheets

(51) Int. Cl.
  *G06K 7/10* (2006.01)
  *H03K 3/012* (2006.01)
  *H03K 5/24* (2006.01)
  *H03K 17/687* (2006.01)
  *H03M 1/66* (2006.01)

(52) U.S. Cl.
  CPC .............. *H03K 3/012* (2013.01); *H03K 5/24* (2013.01); *H03K 17/687* (2013.01); *H03M 1/66* (2013.01)

(58) Field of Classification Search
  CPC .......... H03K 3/011; H03K 3/012; H03K 5/24; H03K 17/687; H03M 1/66; G05F 3/00; G05F 3/02; G05F 3/16; G05F 3/18; G05F 3/185; G05F 3/20; G05F 3/205; G05F 3/24; G05F 3/242; G05F 3/245
  See application file for complete search history.

(56) References Cited

U.S. PATENT DOCUMENTS

| | | | |
|---|---|---|---|
| 8,744,379 B1* | 6/2014 | Sung | H03F 1/0272 455/115.1 |
| 9,360,504 B2* | 6/2016 | Pillin | G06K 19/0713 |
| 2009/0237068 A1* | 9/2009 | Vora | G01R 21/10 324/76.11 |
| 2010/0060425 A1* | 3/2010 | Rodriguez | H04Q 9/00 340/10.1 |
| 2015/0136857 A1 | 5/2015 | Pillin et al. | |
| 2018/0138866 A1* | 5/2018 | Liang | H03K 3/011 |

\* cited by examiner

DETECTOR CIRCUIT FOR AN RFID-DEVICE

FIELD OF THE INVENTION

The present invention relates to the field of detector circuits and in particular to detector circuits suitable for RFID-applications. Moreover, such a detector circuit is normally implemented in a receiver module of an RFID-device, such as an RFID-reader.

BACKGROUND OF THE INVENTION

Radio Frequency IDentification (RFID) can be used for locating and identifying objects. In this context, the RFID-systems are particularly useful for tracking of a large numbers of objects. These systems usually comprise RFID-readers and RFID-tags. When a power management system of an RFID-tag includes an energy storage device, e.g. a battery, then the tags are known as active tags. RFID-tags powered solely by the received RF-signals are called passive tags.

Intrasystem communication is typically conducted by an RFID-reader interrogating one or more RFID-tags by sending a Radio Frequency (RF) wave. In response, the tag that senses the interrogating RF-wave responds by transmitting back an RF-wave.

RFID-readers are subject to especially strict power efficiency requirements. Here, in addition to low power consumption, the reader devices are expected to function at low voltage levels while maintaining their accuracy.

One way to achieve a power-efficient device for RF-communication is presented in the scientific paper "A Folded, Low-Power Ultra-Wideband CMOS Power Detector with an Embedded Amplifier" (Li et al).

A further challenge when designing RFID-readers is the correct detection of the response signal generated by the tags. Typically, the detection takes place in the receiver module of the RFID-reader.

Another challenge is at least in part caused by the greatly varying power value of the response RF-signal. Accordingly, the receiver module needs to have a tightly controlled and stable threshold with respect to the power value of the incoming signal in order to distinguish relevant incoming RF-signals.

In a related context, it has been established that the performance of the power signal detector of the receiver module of the RFID-device is temperature dependent. In consequence, the detector's temperature-dependency negatively affects the accuracy.

SUMMARY OF THE INVENTION

It is therefore an object of the present invention to provide an improved detector circuit implemented in a receiver module of an RFID-device. The improved detector circuit at least alleviates the drawbacks caused by the temperature-dependency of the detector. More specifically, the power detector circuit according to the invention has a substantially flat, i.e. non-variable, response to incoming RF-signals in the relevant temperature range (−40° C. to +85° C.). This, more robust solution is achieved while maintaining the power consumption of the detector circuit at a low level.

Further, the improved detector circuit may be used to detect an envelope function of the incoming RF-signal. More specifically, the detector can be configured to perform both data detection as well as peak power detection by controlling the detector threshold. Once the peak level of an incoming signal is determined via a peak threshold setting, the threshold can be reduced by, for example, 50 percent and the detector output would then provide the digital equivalent of the sliced envelope function from the incoming RF-signal.

Moreover, the improved detector circuit may be manufactured by readily-available, standard semi-conductor components for a cost-efficient production process.

In a first aspect, a detector circuit being part of an RFID-device is provided, which is particularly operable to process signals in RF-domain.

The detector circuit comprises a bias current generator circuit configured to generate an output bias current. This bias current is proportional to the square of a temperature-dependent input current. More precisely, it is to be construed that the term "temperature-dependent" denotes dependency on the absolute temperature. The detector circuit further comprises a first and a second FET-devices (FET—field-effect transistor). These FET-devices are readily-available, for instance the FET-devices could be conventional NMOS-transistors (NMOS—n-channel MOSFETs; where MOSFET stands for metal-oxide-semiconductor field-effect transistors).

The output bias current is used to bias at least one of the first and the second FET-devices. Upon biasing, the FET-device(s) operate(s) in the sub-threshold region. In other words, the FET-devices are in the region of weak inversion where the gate-to-source voltage of the FET-devices is below the devices' nominal threshold voltage.

As a result, variations of the power signal due to temperature differences are compensated for. More specifically, it is hereby achieved a substantially flat detector response over the operating temperature range (−40° C. to +85° C.).

This is achieved while using very small current, less than 2 µA. Moreover, the required voltage level is low as the circuit functions at voltages as low as 1.3 V.

An incoming RF-signal is coupled into at least one of the first and the second FET-devices, and the detector circuit also has a current source for generating a variable threshold current. On the basis of the variable threshold current and the incoming RF-signal, a comparator determines whether the value of the incoming RF-signal exceeds a threshold value. In other words, it is determined whether the detected signal is sufficiently strong to be treated by the receiver of the RFID-reader as being part of a legitimate RFID-communication.

In a preferred embodiment, the bias current generator circuit comprises five FET-devices. Preferably, all five FET-devices of the bias current generator circuit are NMOS-transistors operating in the sub-threshold region. These five FET-devices contribute in creating a bias current that compensates for the thermal variations of the power value of the RF-signal. The bias current generator circuit further comprises a band-gap generator. The band-gap generator contributes in generation of a fixed, reference current needed to establish a bias point/operating point, i.e. a steady-state current flowing when no input signal is applied.

In another embodiment, each of a first and a second NMOS-transistors of the bias current generator circuit are diode-connected and the first and the second NMOS-transistors are connected in series. The diode connection makes the drain-source voltage equal to the gate-source voltage. Thus, the gate voltages of the two NMOS-transistors have the same magnitude. These gate voltages are summed to generate a combined gate voltage at another NMOS-transistor of the circuit. A third NMOS-transistor is biased by a constant, i.e. temperature-invariable, reference current and has a gate-source voltage. The output gate-source voltage of the circuit is then the combined gate voltage of the first and the second NMOS-transistors subtracted by the gate-source voltage of the third NMOS-transistor. This is equivalent to squaring the current flowing at the first and the second NMOS-transistors and subsequently dividing it by the previously mentioned constant reference current. Accordingly, the output of the bias current generator circuit is a current proportional to the square of a temperature-dependent input current.

In another embodiment, an incoming RF-signal is AC-coupled into the first NMOS-transistor of the detector circuit. By way of example, the RF-signal is applied to the NMOS-transistor through a capacitor. The incoming RF-signal could be a signal having the frequency of 915 MHz. This received, analogue signal is subsequently converted to digital signal by means of the various components of the detector circuit.

In a further embodiment, the detector circuit also comprises a third NMOS-transistor, arranged between the first NMOS-transistor and a load device. Moreover, the detector circuit comprises a fourth NMOS-transistor, arranged between the second NMOS-transistor and the load device. The third and the fourth NMOS-transistors are basically used as cascodes to isolate the first and the second NMOS-transistors from the output signals.

In yet another embodiment of the detector circuit, the current source for generating a variable threshold current is a current output digital-to-analogue converter (DAC) connected to the fourth NMOS-transistor and to the load device. This current output DAC is used to provide a reference value for subsequent determination of the threshold value with respect to the power for the incoming RF-signal.

In a related embodiment, the detector circuit further comprises a comparator connected to the load device. The comparator could be a conventional CMOS-comparator (CMOS—complementary metal on semiconductor). The power value of the incoming RF-signal that has been compensated for temperature variations is compared with the reference current by means of the comparator. Hereby, it may be determined when the received RF-signal exceeds the preset threshold level.

In another, slightly structurally different embodiment, an RF-signal is alternately AC-coupled into the first and the second NMOS-transistor and the first and the second FET-devices are alternately biased by means of the output bias current of the bias current generator circuit so that they operate in the sub-threshold region. Further, the bias is applied on the NMOS-transistor at the same time said NMOS-transistor receives the RF-signal and a current of the current output DAC is alternated into a first and a second loads. Hereby, the management of the incoming RF-signal is slightly modified and the value of the available, useful signal is doubled. Consequently, correlated double sampling (CDS) is used to eliminate input offset effects.

In another and independent aspect of the invention a method of alleviating temperature-dependency of a detector circuit being part of an RFID-device is also provided. The method comprises the steps of generating an output bias current that is proportional to the square of a temperature-dependent input current. Subsequently, a first and a second FET-devices in the detector circuit are arranged. In a next step, at least one of the first and the second FET-devices is biased by means of the generated output bias current so that it operates in the sub-threshold region. Furthermore, coupling of an incoming RF-signal into at least one of the first and the second FET-devices is effected whereupon a variable threshold current is generated. In the final step, it is determined, on the basis of the variable threshold current and the incoming RF-signal, whether the value of the incoming RF-signal exceeds a threshold value.

In particular, the present method is operable by means of the detector circuit as described above. Therefore, any features, benefits and general properties of the detector circuit equally apply to the method and vice versa.

BRIEF DESCRIPTION OF THE DRAWINGS

In the following, a preferred embodiment of the invention will be described in a non-limiting and exemplary way by making reference to the drawings, in which.

DETAILED DESCRIPTION OF THE INVENTION

Figure 1:
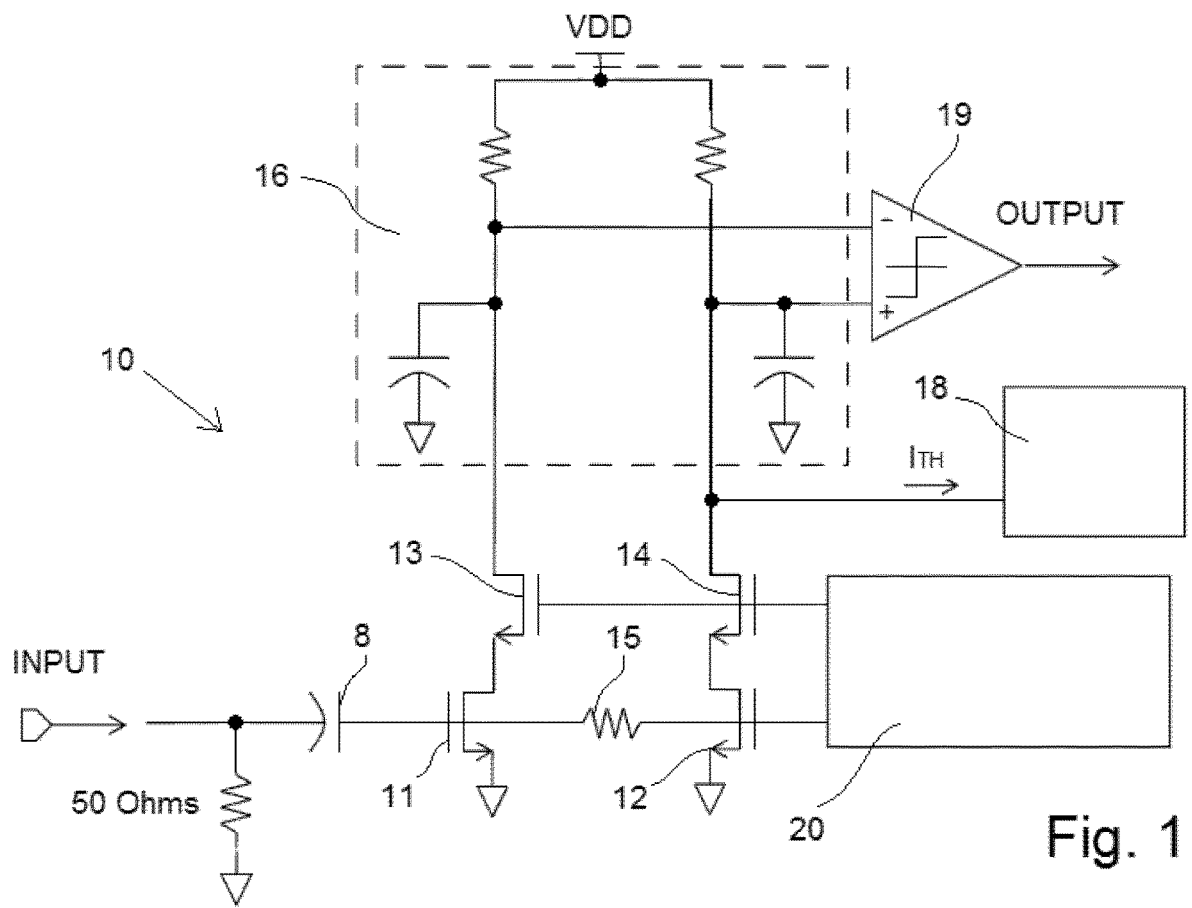
FIG. 1 schematically shows a block diagram of a detector circuit according to one embodiment of the present invention.

Various embodiments are described hereinafter with reference to the Figures. It should be noted that elements of similar structures or functions are represented by like reference numerals throughout the Figures. It should also be noted that the Figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

In FIG. 1 a block diagram of a detector circuit according to one embodiment of the present invention is schematically presented.

In the following, the components and the operation of the detector circuit are discussed in greater detail.

An energy source provides supply voltage $V_{DD}$ between 1.3 V and 2.0 V. A first and a second NMOS-transistors 11, 12 of the detector circuit 10 are biased in weak inversion by an output bias current. This output bias current is generated by a voltage from a bias current generator circuit 20 and compensates for temperature-sensitivity of the detector. The bias current generator circuit 20 will be more thoroughly discussed in connection with FIG. 2. A resistor 15 is connected from the bias current generator circuit 20 to the gate of the NMOS-transistor 11 to allow RF-signals to occur at the transistor gate without loading by the bias current generator 20.

A third NMOS-transistor 13 is arranged between the first NMOS-transistor 11 and a load device 16 whereas a fourth NMOS transistor 14 is arranged between the second NMOS-transistor 12 and the load device 16. The third and the fourth NMOS-transistors 13, 14 are basically used as cascodes in order to isolate the first and the second NMOS-transistors 11, 12 from other electrical signals present in the detector circuit 10.

An RF-signal is applied to a gate of the NMOS-transistor 11 through a capacitor 8. The capacitor 8 and the resistor 15 form a high-pass network that allows RF-signals to pass to the gate of the NMOS-transistor 11. The RF signal is added to the DC-level of the output bias current generator 20, said generator being connected to the first NMOS-transistor 11. As a consequence of the transistor sub-threshold operation non-linearity, the current flowing through the NMOS-transistor 11 is changed and increases with increasing RF-signal level. This current subsequently flows through the load device 16, resulting in a variable voltage being generated at the drain of the NMOS-transistor 13. In the shown embodiment, the load device 16 is a resistor but it could also be a conventional diode.

The NMOS-transistor 12 is only affected by the voltage attributable to the voltage output of bias current generator 20. Accordingly, the drain current of the NMOS-transistor 12 is constant and generates a fixed voltage at the drain of the NMOS-transistor 14.

A current output DAC (DAC—digital-to-analogue converter) 18 is connected to the NMOS-transistor 14 and contributes in generating a threshold current bias. The DAC 18 is also connected to the load device 16. The voltage at the drain of the NMOS-transistor 14 so-to-say corresponds to the aggregate of the current generated by the NMOS-transistor 12 and the current output by the DAC 18. The voltage at the drain of the NMOS-transistor 14 is lower than the voltage at the drain of the NMOS-transistor 13 when no RF-signal is present.

Here, when an increasing RF-signal is applied to the previously discussed coupling capacitor 8, an additional current will flow through the NMOS-transistors 11 and 13 and eventually the voltage at the drain of the NMOS-transistor 13 will become lower than the voltage at the drain of the NMOS-transistor 14.

The detector circuit further comprises a conventional comparator 19 connected to the load device 16. Once the voltage at the drain of the NMOS-transistor 14 exceeds the voltage at the drain of the NMOS-transistor 13, the comparator 19 will signal that the signal detection threshold has been reached. The threshold detection level may then be reset by suitably adapting the current originating from the current output DAC 18.

The solution shown in FIG. 1 is an energy-efficient power detector for incoming RF-signals. As previously discussed, the circuit at hand is suitable for implementation in RFID-applications and hence it complies with strict energy-efficiency requirements—its energy consumption is below 2 μA at a voltage of 1.65 V.

It is to be noted that the circuit needs to be operable in a rather limited signal power interval, ranging between −30 dBm and +15 dBm. Accordingly, the detectable RF-signals are in mW- and μW-domain. Here and as customary in RF-applications, the unit of power level dBm (decibel-milliwatts) is used to designate the power of the incoming RF-signal relative to a 50-ohm impedance.

Further, in the operating temperature range of −40° C. to +85° C. the detector as shown in FIG. 1 ensures a substantially flat response, i.e. the response varies no more than +/−0.5 dB relative to the defined detector threshold power.

As easily inferred from the above, the detector circuit 10 shown in FIG. 1 may be manufactured by readily-available, standard semi-conductor components for a cost-efficient production process.

Additionally, the detector circuit functions as an OOK-demodulator (OOK—on-off keying) as well. For example, in its intended application the detector is enabled 100% of the time looking for RF-signal activity. Once a signal having a value that is above the predetermined level is detected, the threshold is slightly reduced, whereupon the OOK-demodulation may be initiated.

Figure 2:
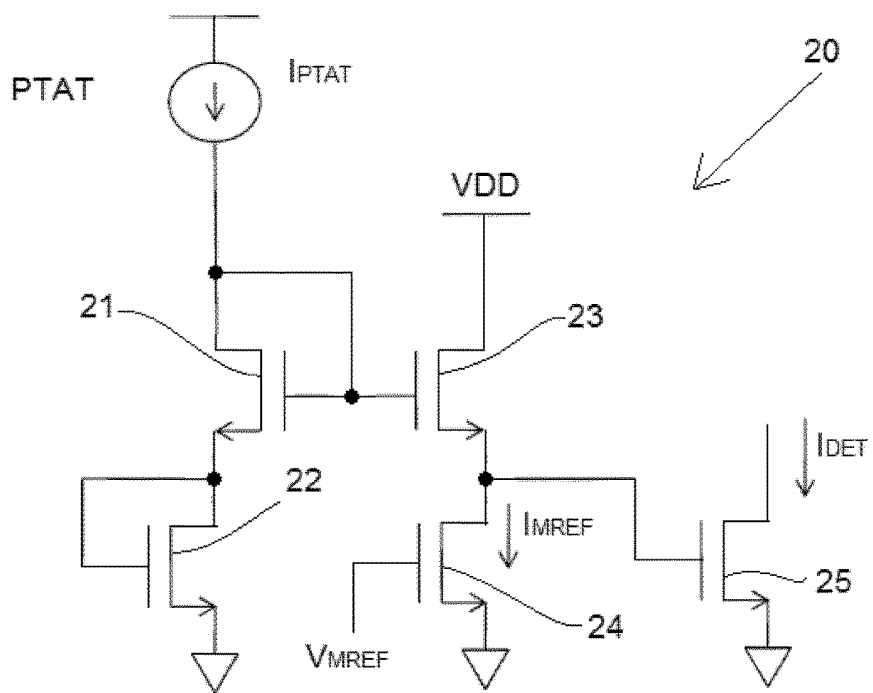
FIG. 2 is a schematic block diagram of a bias current generator circuit usable in the detector circuit of FIG. 1.

In FIG. 2 a schematic block diagram of a bias current generator circuit usable in the detector circuit according to FIG. 1 is shown.

Proportional to absolute temperature (PTAT) current generator circuits are well known in the art. In the art, the biasing current of such a PTAT-current circuit should increase linearly with increasing temperature.

Structurally, the shown circuit 20 comprises five NMOS-transistors 21-25. All of these NMOS-transistors operate in the sub-threshold region, i.e. in weak inversion. The circuit further comprises a band-gap generator that contributes in generation of a constant, temperature-invariant reference current $I_{MREF}$. Each of a first and a second NMOS-transistors 21, 22 are diode-connected. The first and the second NMOS-transistors 21, 22 are even connected in series. A third NMOS-transistor 23 is biased by the constant reference current $I_{MREF}$ mentioned above. A fourth NMOS-transistor 24 generates the reference current $I_{MREF}$, more thoroughly described below. In the shown embodiment, a fifth NMOS-transistor 25 is any one of the NMOS-transistors 11 or 12 of FIG. 1 so that a circuit output current $I_{DET}$ occurs in this transistor.

In the following the operation of the circuit of FIG. 2 will be discussed in greater detail.

Voltage $V_{DD}$ is supplied to the circuit 20. The PTAT-input current $I_{PTAT}$ is generated in a separate circuit via PMOS- and NMOS-transistors operating in the sub-threshold region to form a PTAT-voltage which is applied to a resistor to form the PTAT-current. As seen, the PTAT-input current $I_{PTAT}$ is fed to the NMOS-transistors 21 and 22. As disclosed above, each of the first and the second NMOS-transistors 21 and 22 are diode-connected and the first and the second NMOS-transistors 21, 22 are even connected in series. Consequently, NMOS-transistors 21, 22 each achieve a gate-source voltage, $V_{PTAT}$ that is a function of the natural logarithm of the PTAT-input current. The diode-connection of the respective NMOS-transistor 21, 22 makes the drain-source voltage equal to the gate-source voltage. Thus, the two gate voltages $V_{PTAT}$ associated with NMOS-transistors 21 and 22, respectively, are summed to result in a gate voltage at the NMOS-transistor 23 of twice the value of $V_{PTAT}$, i.e. $2 \cdot V_{PTAT}$.

The NMOS-transistor 23 is biased by a constant, temperature-invariant reference current $I_{MREF}$ provided by the NMOS-transistor 24 and its gate-source voltage is then $V_{MREF}$.

Considering the above, the gate-source voltage associated with NMOS-transistor 25, or equivalently, any one of the input NMOS-transistors 11 and 12 of FIG. 1, is $2 \cdot V_{PTAT}$ subtracted by $V_{MREF}$. Since all of the voltages are natural logarithms of the currents and all transistor-devices of the circuit 20 are assumed to be of the same dimensions, summing the voltages becomes equivalent to multiplying the currents. Similarly, subtracting the voltages is equivalent to dividing the currents. Thus the output current $I_{DET}$, occurring at the NMOS-transistor 25, of the bias current generator circuit 20 is the square of the current $I_{PTAT}$ divided by the reference current $I_{MREF}$. Hereby it is achieved that the output current $I_{DET}$ is proportional to the square of temperature.

Conclusively, the inputs into the shown circuit 20 of FIG. 2 are the obtained PTAT-current and the constant reference current $I_{MREF}$. The resulting output current $I_{DET}$ is the square of the PTAT-current divided by the constant reference current $I_{MREF}$. The output current $I_{DET}$ is the bias current of the NMOS-transistors 11 and 12 of the detector circuit discussed in connection with FIG. 1.

Above rationale is supported by the following equations:

Drain Current: $I_D=(W/L)\cdot I_S \cdot e^{[q\cdot VGS/(n\cdot k\cdot T)]}$

Gate Voltage: $V_{GS}=(n\cdot k\cdot T/q)\cdot \ln(L\cdot I_D/(W\cdot I_S))$

Figure 3:
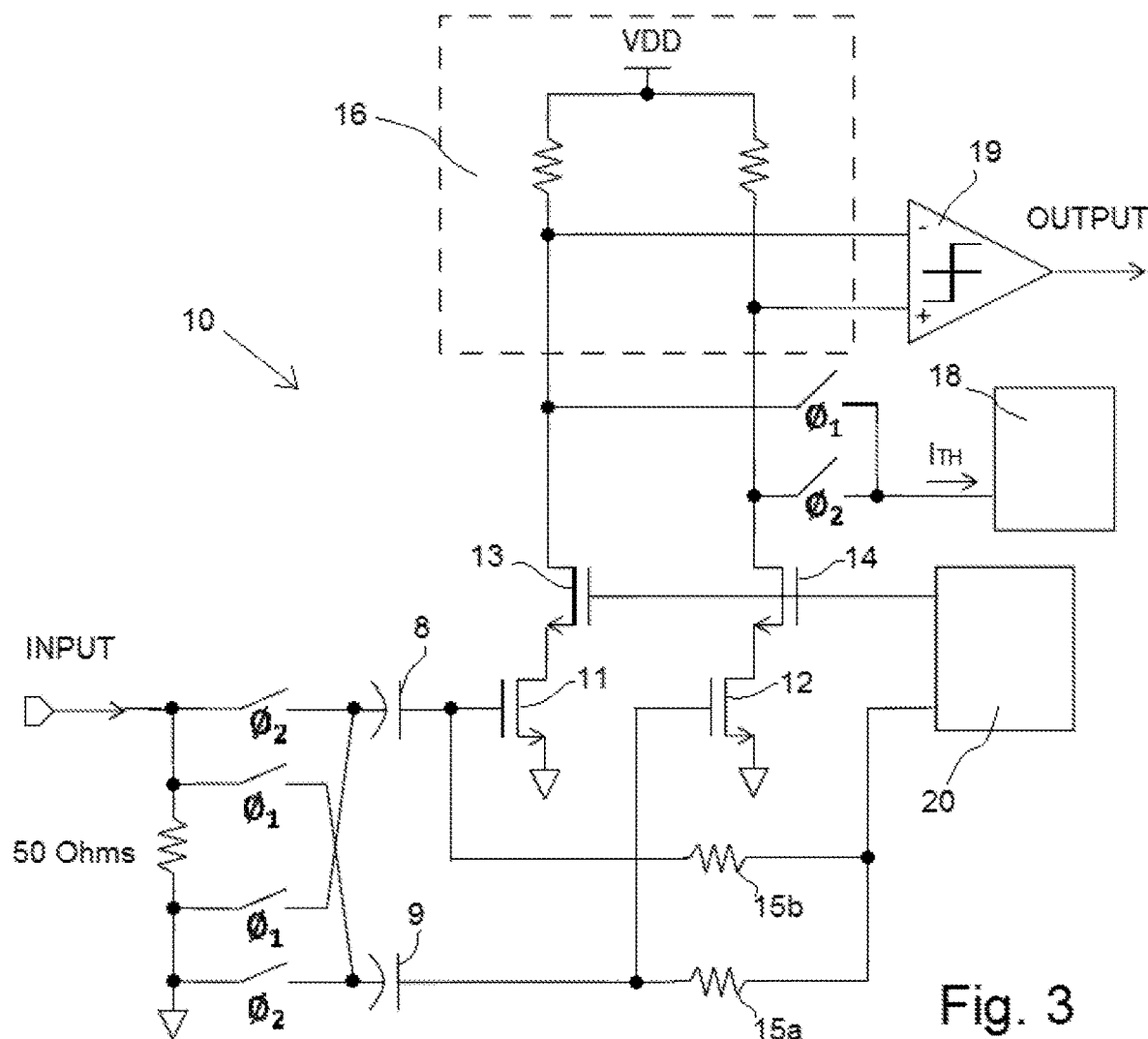
FIG. 3 schematically shows a block diagram of a detector circuit according to another embodiment of the present invention.

Voltage Loop: $V_{GS1}+V_{GS2}=V_{GS3}+V_{GS5}$ $(n\cdot k\cdot T/q)\cdot \ln(L\cdot I_{PTAT}/(W\cdot I_S))+(n\cdot k\cdot T/q)\cdot \ln(L\cdot I_{PTAT}/(W\cdot I_S))=(n\cdot k\cdot T/q)\cdot \ln(L\cdot I_{MREF}/(W\cdot I_S))+(n\cdot k\cdot T/q)\cdot \ln(L\cdot I_{DET}/(W\cdot I_S))$ $\ln(L\cdot I_{PTAT}/(W\cdot I_S))+\ln(L\cdot I_{PTAT}/(W\cdot I_S))=\ln(L\cdot I_{MREF}/(W\cdot I_S))+\ln(L\cdot I_{DET}/(W\cdot I_S))$ $2\cdot \ln(L\cdot I_{PTAT}/(W\cdot I_S))-\ln(L\cdot I_{MREF}/(W\cdot I_S))=\ln(L\cdot I_{DET}/(W\cdot I_S))$ $\ln(L\cdot (I_{PTAT})^2/(W\cdot I_S\cdot I_{MREF}))=\ln(L\cdot I_{DET}/(W\cdot I_S))$ $\rightarrow L\cdot (I_{PTAT})^2/(W\cdot I_S\cdot I_{MREF}))=L\cdot I_{DET}/(W\cdot I_S))\rightarrow (I_{PTAT})^2/I_{MREF}=I_{DET}$ FIG. 3 schematically shows a block diagram of the detector circuit according to another embodiment of the present invention. With reference to FIG. 3 and for the sake of brevity, the circuit components thoroughly described in conjunction with FIG. 1 are not further discussed.

In FIG. 3 are switches which are enabled during one of two clock phases each defined as phase 1 or $\phi_1$ and phase 2 or $\phi_2$. $\phi_1$ and $\phi_2$ sequentially alternate, that is $\phi_1$ occurs first, then $\phi_2$, then $\phi_1$, followed by $\phi_2$ and the sequence continues as long as the circuit is enabled.

As seen in FIG. 3, an RF-signal is alternately AC-coupled into the first and the second NMOS-transistors 11, 12 via capacitors 8, 9 during a first $\phi_1$ and a second $\phi_2$ phase, respectively. Simultaneously, the first and the second NMOS-transistors 11, 12 are continuously biased by means of the output voltage of the bias generator circuit 20 via resistors 15a and 15b, respectively. Once again, the NMOS-transistors 11, 12 operate in the sub-threshold region. Further, the output bias current is applied on one of the NMOS-transistors 11, 12 at the same time said NMOS-transistor receives the RF-signal. At the same time, current of the current output DAC 18 is alternated into loads (not shown) during the first $\phi_1$ and the second $\phi_2$ phase, respectively.

Accordingly, the management of the incoming RF-signal is slightly modified compared to the embodiment of FIG. 1. As a result, the quantity of the available signals is doubled. Hence, a technique such as correlated double sampling (CDS) and subsequent signal subtraction may be used to eliminate undesired offset effects from the signal input stage. In this context, offset errors are due to errors between NMOS-transistors 11 and 12, errors between NMOS-transistors 13 and 14, errors between load resistors 16 and errors occurring within the comparator 19. Hereby, the total path from RF input to comparator input may be offset-corrected, thereby allowing signals smaller than the device offset levels to pass through to the detector output.

In the drawings and the description, there have been disclosed typical preferred embodiments of the invention and, although specific terms are employed, they are used in a generic and descriptive sense only and not for purposes of limitation, the scope of the invention being set forth in the following claims.

What is claimed is:

1. A detector circuit being part of a Radio Frequency Identification (RFID) device, and comprising:
    a bias current generator circuit configured to generate an output bias current that is proportional to the square of a temperature-dependent input current;
    first and second Field-Effect Transistor (FET) devices;
    at least one of the first and the second FET devices being biased by means of the output bias current of the bias current generator circuit so that said at least one of the first and the second FET devices operates in a sub-threshold region;
    an incoming Radio Frequency (RF) signal being coupled into at least one of the first and the second FET devices;
    a current source configured to generate a variable threshold current; and
    a comparator configured to determine, based on the variable threshold current and the incoming RF signal, whether a value of the incoming RF signal exceeds a threshold value,
    wherein the first and the second FET devices are first and second n-channel metal-oxide-semiconductor (NMOS) transistors,
    wherein the bias current generator circuit comprises a band-gap generator,
    wherein each of a first NMOS transistor and a second NMOS transistor is diode-connected,
    wherein the first and the second NMOS transistors are connected in series, and
    wherein a third NMOS transistor is biased by a constant reference current.

2. The detector circuit according to claim 1, wherein the bias current generator circuit comprises five FET devices.

3. The detector circuit according to claim 2, wherein FET devices of the bias current generator circuit are n-channel metal-oxide-semiconductor (NMOS) transistors operating in the sub-threshold region.

4. The detector circuit according to claim 1, wherein the incoming RF signal is AC-coupled into the first NMOS transistor.

5. The detector circuit according to claim 1, further comprising a third NMOS transistor, arranged between the first NMOS transistor and a load device.

6. The detector circuit according to claim 5, the detector circuit further comprising a fourth NMOS transistor, arranged between the second NMOS transistor and the load device.

7. The detector circuit according to claim 6, wherein the current source configured to generate the variable threshold current is a current output digital-to-analogue converter (DAC) connected to the fourth NMOS transistor and to the load device.

8. The detector circuit according to claim 6, wherein the comparator configured to determine whether the value of the incoming RF signal exceeds the threshold value is connected to the fourth NMOS transistor and to the load device.

9. A detector circuit being part of a Radio Frequency Identification (RFID) device, and comprising:
    a bias current generator circuit configured to generate an output bias current that is proportional to the square of a temperature-dependent input current;
    first and second Field-Effect Transistor (FET) devices;
    at least one of the first and the second FET devices being biased by means of the output bias current of the bias current generator circuit so that said at least one of the first and the second FET devices operates in a sub-threshold region;

an incoming Radio Frequency (RF) signal being coupled into at least one of the first and the second FET devices;
a current source configured to generate a variable threshold current; and
a comparator configured to determine, based on the variable threshold current and the incoming RF signal, whether a value of the incoming RF signal exceeds a threshold value,
wherein the first and the second FET devices are first and second n-channel metal-oxide-semiconductor (NMOS) transistors,
wherein the RF signal is alternately AC-coupled into the first and the second NMOS transistors and the first and the second FET devices are alternately biased by means of the output bias current of the bias current generator circuit so that the first and the second FET devices operate in the sub-threshold region.

10. The detector circuit according to claim 9, wherein a bias is applied on the first and the second NMOS transistors at the same time the first and the second NMOS transistors receive the RF signal.

11. The detector circuit according to claim 10, wherein current of a current output digital-to-analogue converter (DAC) is alternated into a first and a second load.

* * * * *